(12) United States Patent
Yanagisawa

(10) Patent No.: US 11,329,453 B2
(45) Date of Patent: May 10, 2022

(54) SURFACE EMITTING LASER

(71) Applicant: SUMITOMO ELECTRIC INDUSTRIES, LTD., Osaka (JP)

(72) Inventor: Masaki Yanagisawa, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 164 days.

(21) Appl. No.: 16/859,058

(22) Filed: Apr. 27, 2020

(65) Prior Publication Data

US 2020/0412095 A1 Dec. 31, 2020

(30) Foreign Application Priority Data

Jun. 28, 2019 (JP) .............................. JP2019-122048

(51) Int. Cl.
| | |
|---|---|
| *H01S 5/183* | (2006.01) |
| *H01S 5/028* | (2006.01) |
| *H01S 5/343* | (2006.01) |
| *H01S 5/22* | (2006.01) |
| *H01S 5/042* | (2006.01) |
| *H01S 5/187* | (2006.01) |

(52) U.S. Cl.
CPC ........ *H01S 5/18361* (2013.01); *H01S 5/0282* (2013.01); *H01S 5/04256* (2019.08); *H01S 5/187* (2013.01); *H01S 5/18394* (2013.01); *H01S 5/2206* (2013.01); *H01S 5/34313* (2013.01)

(58) Field of Classification Search
CPC .......................... H01S 5/18361; H01S 5/04256
USPC ....................................................... 372/43.01
See application file for complete search history.

(56) References Cited

U.S. PATENT DOCUMENTS

| | | | | |
|---|---|---|---|---|
| 6,037,616 | A * | 3/2000 | Amamiya | H01L 29/7371 257/E29.189 |
| 6,392,262 | B1 * | 5/2002 | Shiraishi | H01L 29/66318 257/280 |
| 2003/0031221 | A1 * | 2/2003 | Wang | H01S 5/18366 372/45.01 |
| 2010/0232465 | A1 * | 9/2010 | Tsukiji | H01S 5/04252 438/22 |
| 2012/0094408 | A1 * | 4/2012 | Onishi | H01S 5/18311 438/29 |

FOREIGN PATENT DOCUMENTS

JP 2019-033210 2/2019

* cited by examiner

*Primary Examiner* — Tuan N Nguyen
(74) *Attorney, Agent, or Firm* — IPUSA, PLLC

(57) ABSTRACT

A surface emitting laser includes a substrate, a mesa of semiconductor layers including a lower reflector layer, an active layer, an upper reflector layer, and an upper contact layer that are successively laminated on the substrate, and an electrode provided on the upper contact layer. The upper contact layer includes GaAs. The electrode includes an alloy layer including Pt, in contact with the upper contact layer.

15 Claims, 10 Drawing Sheets

SURFACE EMITTING LASER

CROSS-REFERENCE TO RELATED APPLICATIONS

This application is based upon and claims priority to Japanese Patent Application No. 2019-122048 filed on Jun. 28, 2019, the entire contents of which are incorporated herein by reference.

BACKGROUND OF THE INVENTION

1. Field of the Invention

Embodiments of the present disclosure are related to a surface emitting laser.

2. Description of the Related Art

A vertical cavity surface emitting laser (VCSEL) is an example of the surface emitting laser. An example of the VCSEL includes two reflector layers, and an active layer sandwiched between the two reflector layers, that are provided on a semiconductor substrate. The VCSEL emits laser light in a perpendicular direction with respect to a substrate surface of the semiconductor substrate. In the VCSEL, a mesa is formed in the active layer, the reflector layers, or the like, and portions of the reflector layers in the mesa are selectively oxidized, to form a current constriction structure. An example of such a VCSEL is described in Japanese Laid-Open Patent Publication No. 2019-33210, for example.

In the VCSEL, contact layers are provided to sandwich the two reflector layers and the active layer between the contact layers, in order to inject a current into the VCSEL. The contact layers are heavily doped with an impurity element, so as to increase the conductivity thereof. Hence, when the contact layer on the side from which the laser light is emitted is thick, the laser light is absorbed by the thick contact layer, thereby causing the optical output to decrease. For this reason, the contact layer on the side from which the laser light is emitted is preferably thin, however, when this contact layer is too thin, a contact resistance of this contact layer becomes high, thereby preventing an electrode from making a satisfactory ohmic contact with this contact layer in some cases.

In view of the above, there are demands for a surface emitting laser that enables the electrode to make a satisfactory ohmic contact with the contact layer, and reduces the light absorption by the contact layer.

SUMMARY OF THE INVENTION

One object of the embodiments of the present disclosure is to provide a surface emitting laser that enables an electrode to make a satisfactory ohmic contact with a contact layer, and reduces the light absorption by the contact layer.

According to one aspect of the embodiments of the present disclosure, a surface emitting laser including a substrate; a mesa of semiconductor layers including a lower reflector layer, an active layer, an upper reflector layer, and an upper contact layer that are successively laminated on the substrate; and an electrode provided on the upper contact layer, wherein the upper contact layer includes GaAs, and wherein the electrode includes an alloy layer including Pt, in contact with the upper contact layer.

Other objects and further features of the present disclosure will be apparent from the following detailed description when read in conjunction with the accompanying drawings.

DESCRIPTION OF THE EMBODIMENTS

Figure 1:
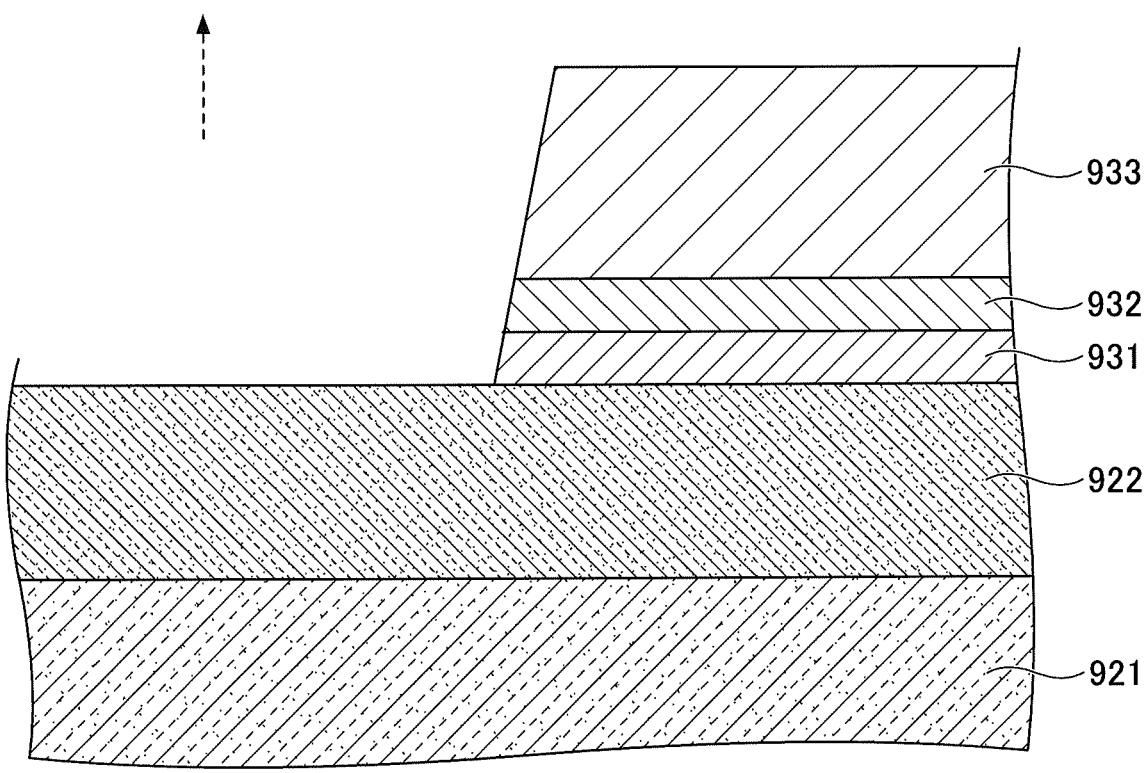
FIG. 1 is a diagram for explaining an electrode of a surface emitting laser.

Embodiments of the present disclosure will be described in the following.

The embodiments of the present disclosure will be described in an arbitrary order. In the following description, the same elements or corresponding elements will be described using the same reference numerals, and a repeated description of the same or corresponding elements will be omitted.

Embodiments of Present Disclosure

A surface emitting laser according to one embodiment of the present disclosure includes a substrate, a mesa of semiconductor layers including a lower reflector layer, an active layer, an upper reflector layer, and an upper contact layer that are successively laminated on the substrate, and an electrode provided on the upper contact layer, wherein the upper contact layer includes GaAs, and wherein the electrode includes an alloy layer including Pt, in contact with the upper contact layer.

In this case, an electrode can make a satisfactory ohmic contact with the upper contact layer, and the light absorption by the upper contact layer can be reduced.

In the surface emitting laser according to one embodiment noted above under [1], the alloy layer including Pt may have a thickness of 5 nm or greater and 100 nm or less.

In this case, the electrode can make a satisfactory ohmic contact with the upper contact layer, and the light absorption by the upper contact layer can be reduced.

In the surface emitting laser according to one embodiment noted above under [1], the upper contact layer may have a thickness of 10 nm or greater and 200 nm or less.

In this case, the electrode can make a satisfactory ohmic contact with the upper contact layer, and the light absorption by the upper contact layer can be reduced.

In the surface emitting laser according to one embodiment noted above under [1], the electrode may include a Ti layer and a Pt layer that are successively laminated on the alloy layer.

In this case, the electrode can make a satisfactory ohmic contact with the upper contact layer.

In the surface emitting laser according to one embodiment noted above under [1], the electrode may have a circular ring shape, and an inner side of the electrode may include a light emitting window though which laser light is emitted.

In this case, the light absorption by the upper contact layer can be reduced.

Details of Embodiments of Present Disclosure

One embodiment of the present disclosure will be described in the following, however, the present invention is not limited to this one embodiment.

First, an ohmic contact of an electrode with a contact layer of the surface emitting laser will be described.

FIG. 1 is a diagram for explaining the electrode of the surface emitting laser. As illustrated in FIG. 1, in the surface emitting laser, an upper contact layer 922 is formed on an upper reflector layer 921, and laser light is emitted in a direction indicated by a dashed arrow. The upper contact layer 922 is heavily doped with an impurity element, so as to increase the conductivity thereof. For example, gallium arsenide (GaAs) forming the upper contact layer 922 is heavily doped with zinc (Zn) and/or carbon (C), as the impurity element, to an impurity concentration of $1 \times 10^{19}$ $cm^{-3}$ or higher. When GaAs is heavily doped with the impurity to the high impurity concentration, a portion of the laser light is absorbed by the upper contact layer 922, thereby causing the optical output, that is, the output of the laser light emitted from the surface emitting laser, to decrease. For this reason, the upper contact layer 922 is preferably thin.

A p-electrode is formed on the upper contact layer 922. The p-electrode is formed by successively depositing a titanium (Ti) layer 931, a platinum (Pt) layer 932, and a gold (Au) layer 933 on the upper contact layer 922, and subjecting this laminated structure to a heat treatment (or thermal process). By this heat treatment, an alloy layer including Ti is formed at an interface between the upper contact layer 922 and the Ti layer 931, thereby providing an ohmic contact.

The alloy layer including Ti, that is formed by the heat treatment, increases the thickness thereof as the temperature of the heat treatment becomes higher, and also increases the thickness thereof as the duration of the heat treatment becomes longer. When the upper contact layer 922 is thin, the alloy layer including Ti may penetrate the upper contact layer 922 and reach the upper reflector layer 921, thereby increasing the resistance. For this reason, although the upper contact layer 922 needs to be thick to a certain extent, if the upper contact layer 922 were too thick, the upper contact layer 922 would inconveniently absorb the laser light because the upper contact layer 922 is heavily doped with the impurity element.

Accordingly, there are demands for a surface emitting laser that enables the electrode to make a satisfactory ohmic contact with the contact layer, even when the contact layer is thin.

Surface Emitting Laser

Figure 2:
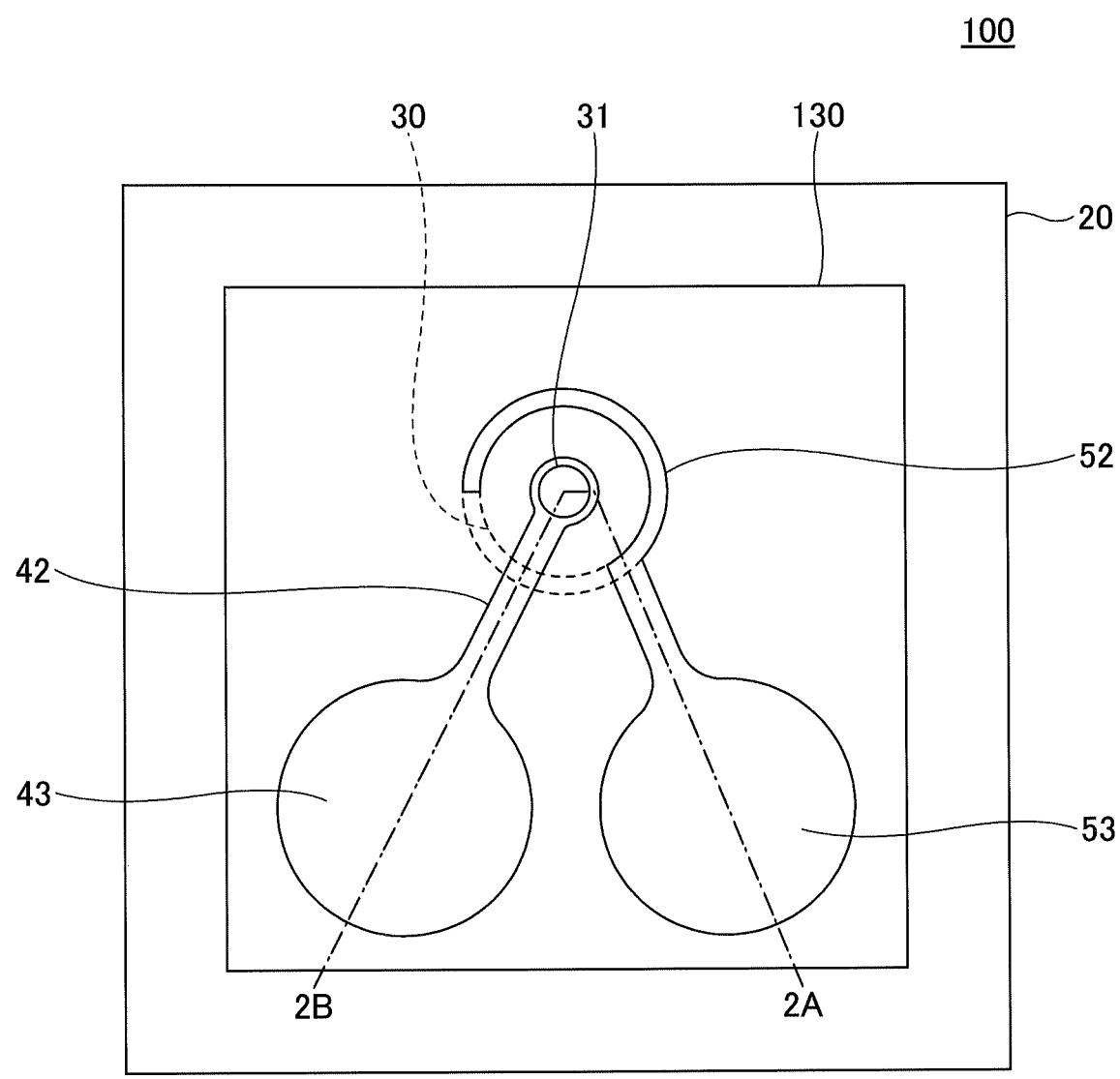
FIG. 2 is a top view of the surface emitting laser according to one embodiment of the present disclosure.
Figure 3:
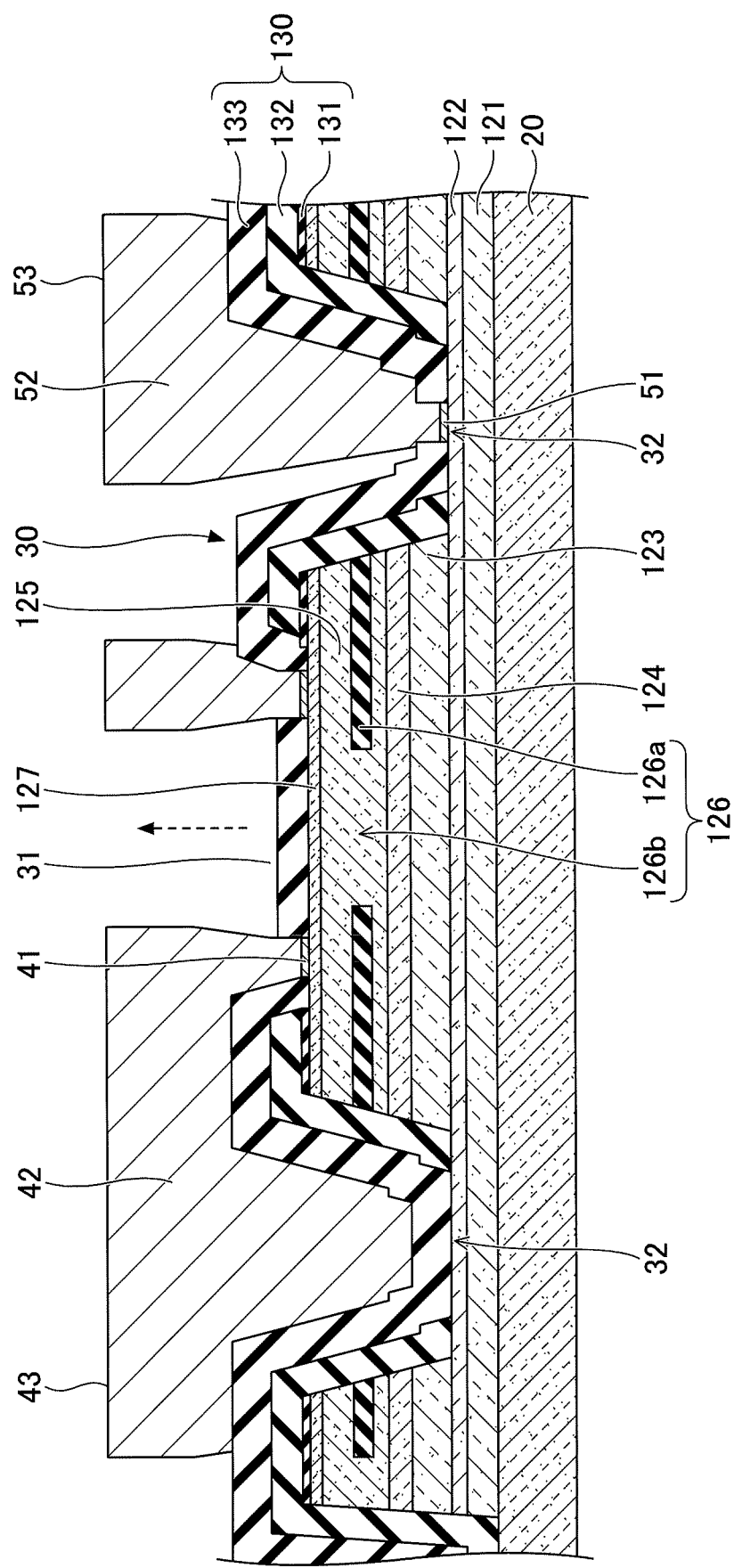
FIG. 3 is a cross sectional view of the surface emitting laser according to one embodiment of the present disclosure.

Next, the surface emitting laser according to one embodiment will be described, by referring to FIG. 2 and FIG. 3. FIG. 2 is a top view of the surface emitting laser according to one embodiment. FIG. 3 is a cross sectional view of the surface emitting laser according to one embodiment, along a one-dot chain line 2A-2B in FIG. 2.

As illustrated in FIG. 3, the surface emitting laser according to one embodiment includes a first lower distributed Bragg reflector (DBR) layer 121, a lower contact layer 122, a second lower DBR layer 123, an active layer 124, an upper DBR layer 125, and an upper contact layer 127 that are successively formed on a substrate 20. In this specification, the second lower DBR layer 123, or the first lower DBR layer 121 and the second lower DBR layer 123, may be referred to as a lower reflector layer. On the other hand, the upper DBR layer 125 may be referred to as an upper reflector layer.

An oxidation region (or area) 126a is formed on the upper DBR layer 125, by oxidizing a portion of a plurality of layers forming the upper DBR layer 125. By forming the oxidation region 126a, a region that is not oxidized becomes an aperture region (or area) 126b. Hence, in the surface emitting laser, a current constriction structure 126 is formed by the oxidation region 126a and the aperture region 126b. The oxidation region 126a may be formed by performing the oxidation from a peripheral edge portion of a mesa 30. The oxidation region 126a includes aluminum oxide ($Al_2O_3$), for example, and has insulating properties, so that a current less easily flows in the oxidation region 126a than in the aperture region 126b. Accordingly, the current more easily flows in the aperture region 126b than in the oxidation region 126a, thereby providing a current path. An efficient current injection becomes possible by the current constriction structure 126 including the oxidation region 126a and the aperture region 126b. In one embodiment, the aperture region 126b may have a diameter of 7.5 µm, for example.

The substrate 20 may be a semiconductor substrate formed by GaAs, for example. A buffer layer (not illustrated) formed by GaAs and aluminum gallium arsenide (AlGaAs), may be provided between the substrate 20 and the first lower DBR layer 121.

The first lower DBR layer 121, the second lower DBR layer 123, and the upper DBR layer 125 may be formed by a semiconductor multilayer in which $Al_xGa_{1-x}As$ (x=0.9) and $Al_yGa_{1-y}As$ (y=0.1) are alternately laminated, for example. The first lower DBR layer 121 is an intrinsic type (i-type) semiconductor layer that is not doped with an impurity element. The second lower DBR layer 123 is an n-type semiconductor layer that is doped with silicon (Si), as the impurity element, to an impurity concentration of $7 \times 10^{17}$ $cm^{-3}$ or higher and $4 \times 10^{18}$ $cm^{-3}$ or lower, for example. The upper DBR layer 125 is an n-type semiconductor layer that is doped with Zn, as the impurity element, to an impurity concentration of $1 \times 10^{18}$ $cm^{-3}$ or higher and $2 \times 10^{19}$ $cm^{-3}$ or lower, for example.

The lower contact layer 122 may be formed by an n-type $Al_xGa_{1-x}As$ (x=0.1) layer that has a thickness of 500 nm, and is doped with Si, as the impurity element, to an impurity concentration of $2 \times 10^{19}$ $cm^{-3}$, for example. The upper contact layer 127 may be formed by a p-type $Al_xGa_{1-x}As$ (x=0.16) layer that has a thickness of 100 nm, and is doped with Zn, as the impurity element, to an impurity concentration of $1 \times 10^{19}$ cm$^{-3}$, for example. The thickness of the upper contact layer 127 is preferably 10 nm or greater and 200 nm or less, and thinner than the lower contact layer 122.

The active layer 124 may be formed by a multiple quantum well (MQW) structure in which an indium gallium arsenide layer and a AlGaAs layer are alternately laminated, for example. More particularly, the active layer 124 may be formed by a MQW structure in which $In_yGa_{1-y}As$ (y=0.1) and $Al_xGa_{1-x}As$ (x=0.3) are alternately laminated, for example. Of course, the first lower DBR layer 121, the lower contact layer 122, the second lower DBR layer 123, the active layer 124, the upper DBR layer 125, and the upper contact layer 127, other than the substrate 20, may be formed by compound semiconductors other than the semiconductors described above.

The mesa 30 is formed by the second lower DBR layer 123, the active layer 124, the upper DBR layer 125, and the upper contact layer 127. More particularly, the mesa 30 of the semiconductor layers is formed by removing the second lower DBR layer 123, the active layer 124, the upper DBR layer 125, and the upper contact layer 127 in a periphery of a region where the mesa 30 is to be formed, to form a groove 32. A height of the mesa 30 may be 4.5 μm or greater and 5.0 μm or less, for example. A width of an upper surface of the mesa 30 may be 30 μm, for example. The active layer 124, the upper DBR layer 125, and the upper contact layer 127 are formed at a central portion of the mesa 30.

An insulating layer 130 is formed on the semiconductor layers forming the mesa 30, including the upper surface and side surfaces of the mesa 30. The insulating layer 30 may be formed by silicon nitride (SiN), silicon oxynitride (SiON), or the like, for example. In one embodiment, the insulating layer 130 is formed by a first insulating layer 131, a second insulating layer 132, and a third insulating layer 133.

A p-electrode 41 is formed on the upper contact layer 127 at the upper surface of the mesa 30, and an n-electrode 51 is formed on the lower contact layer 122 exposed at a bottom surface of the groove 32. An interconnect 42, that connects to a p-electrode pad 43, is provided on the p-electrode 41 at the upper surface of the mesa 30. An interconnect 52, that connects to an n-electrode pad 53, is provided on the n-electrode 51 at the bottom surface of the groove 32.

Figure 4:
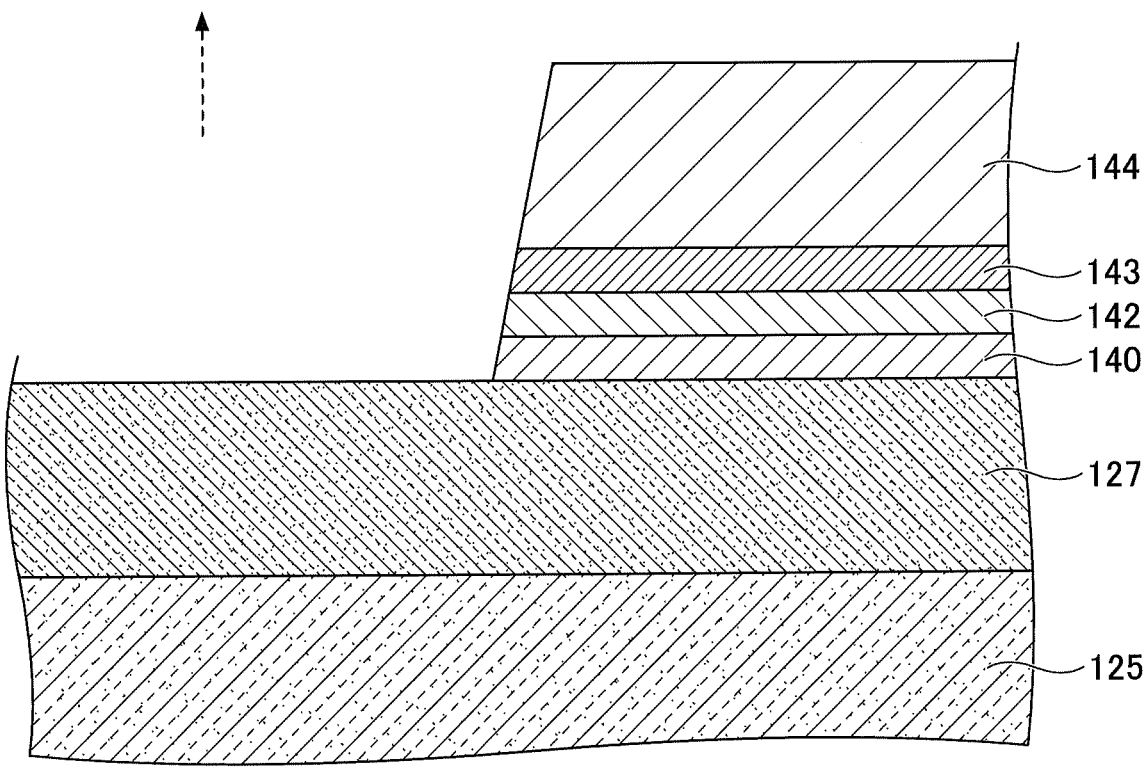
FIG. 4 is a diagram for explaining the electrodes of the surface emitting laser according to one embodiment of the present disclosure.
Figure 5:
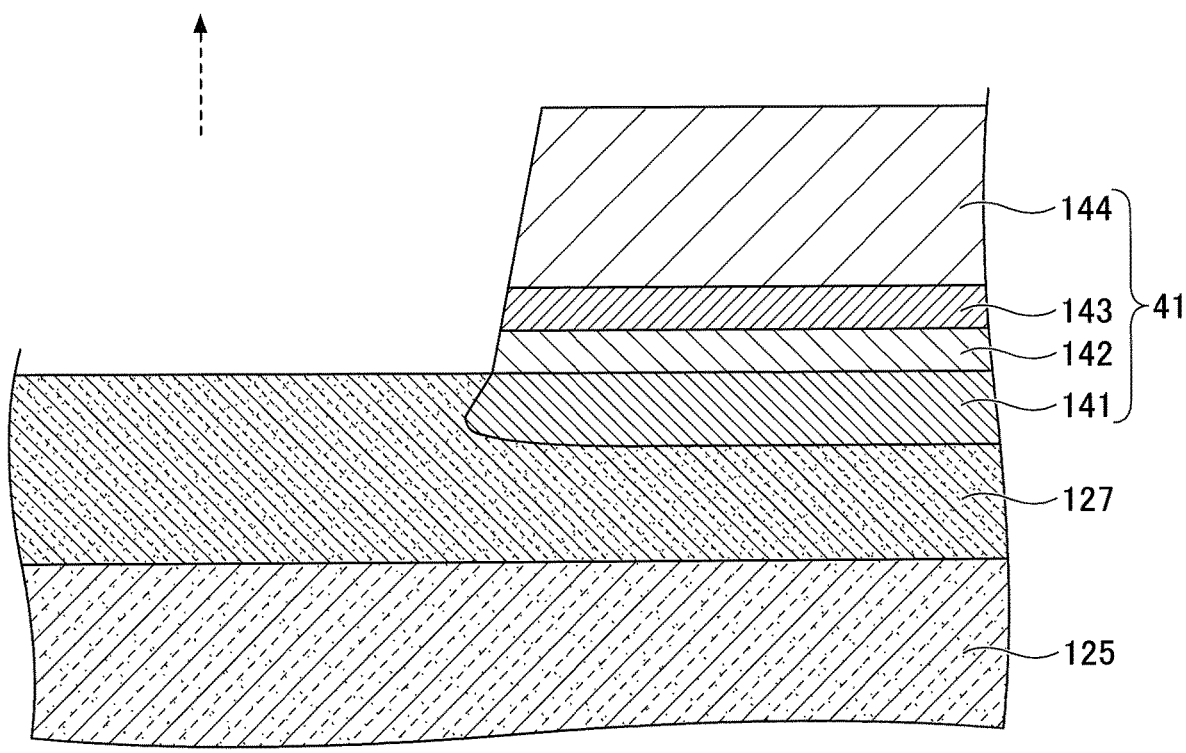
FIG. 5 is a diagram for explaining the electrodes of the surface emitting laser according to one embodiment of the present disclosure.

In one embodiment, the p-electrode 41 is formed by successively laminating layers of Pt, Ti, Pt, and Au to form a Pt/Ti/Pt/Au structure, and subjecting this Pt/Ti/Pt/Au structure to a heat treatment (or thermal process). More particularly, as illustrated in FIG. 4, a first Pt layer 140, a Ti layer 142, a second Pt layer 143, and a Au layer 144 are successively deposited on the upper contact layer 127, and the heat treatment is thereafter performed. FIG. 4 is a diagram for explaining the electrodes of the surface emitting laser according to one embodiment. Hence, an alloy layer 141 including Pt, is formed by GaAs forming the upper contract layer 127, and the first Pt layer 140 maxing contact with the upper contact layer 127, as illustrated in FIG. 5. FIG. 5 is a diagram for explaining the electrodes of the surface emitting laser according to one embodiment.

According to one embodiment, the p-electrode 41 has a structure in which the alloy layer 141 including Pt, the Ti layer 142, the second Pt layer 143, and the Au layer 144 are successively laminated. A thickness of the first Pt layer 140 that may be deposited is 2 nm or greater and 50 nm or less, for example. A thickness of the Ti layer 142 that may be deposited is 5 nm or greater and 50 nm or less, for example. A thickness of the second Pt layer 143 that may be deposited is 5 nm or greater and 50 nm or less, for example. A thickness of the Au layer 144 that may be deposited is 50 nm or greater and 500 nm or less, for example.

By providing the second Pt layer 143 under the Au layer 144, it is possible to prevent the Au of the Au layer 144 from diffusing into the upper contact layer 127 during the heat treatment. By providing the Ti layer 142 between the alloy layer 141 including Pt, and the second Pt layer 143, to make contact therewith, it is possible to increase the adhesion among the layers forming the p-electrode 41. Accordingly, it is possible to obtain a satisfactory ohmic contact between the p-electrode 41 and the upper contact layer 127.

In this example, a thickness of the alloy layer 141 including Pt is approximately two times the thickness of the first Pt layer 140, and the alloy layer 141 including Pt does not become thicker even when the duration of the heat treatment is long. Accordingly, when the thickness of the first Pt layer 140 is 2 nm or greater and 50 nm or less, the thickness of the alloy layer 141 including Pt is 5 nm or greater and 100 nm or less. When the thickness of the upper contact layer 127 is approximately four times the thickness of the first Pt layer 140 or greater, that is, when the thickness of the upper contact layer 127 is 5 nm, for example, the thickness of the upper contact layer 127 may be 20 nm or greater, so that the upper contact layer 127 having the thickness of approximately 10 nm or greater, that is, approximately one-half the upper contact layer thickness before the alloying, remains under the alloy layer 141 including Pt. As a result, it is possible to prevent a contact resistance of the upper contact layer 127 from becoming high. For this reason, it is possible to reduce the light absorption by reducing the thickness of the upper contact layer 127, and to prevent the contact resistance of the upper contact layer 127 from becoming high.

Hence, in the surface emitting laser according to one embodiment, the light absorption by the upper contact layer 127 can be reduced, and the satisfactory ohmic contact can be obtained between the p-electrode 41 and the upper contact layer 127.

The p-electrode 41 has a height of approximately 6 μm from the bottom surface of the groove 32, and the p-electrode 41 is formed on the upper surface of the mesa 30 that has a diameter of 30 μm, for example. In addition, the p-electrode 41 is formed to the circular ring shape having an inner diameter of 20 μm, and an outer diameter of 28 μm, for example.

The n-electrode 51 is formed by an alloy layer of gold (Au), germanium (Ge), and nickel (Ni), and has a thickness of approximately 200 nm, for example. The interconnect 42, the interconnect 52, the p-electrode pad 43, and the n-electrode pad 53 may be formed by a metal, such as Au or the like, for example.

In the surface emitting laser according to one embodiment, bonding wires (not illustrated) are connected to the p-electrode pad 43 and the n-electrode pad 53, when injecting the current into the surface emitting laser. The injection of the current causes the light emitted from the active layer 124 to oscillate by the first lower DBR layer 121, the second lower DBR layer 123, and the upper DBR layer 125 that form a resonator. Hence, the laser light is emitted in the direction indicated by the dashed arrow, via a light emitting window 31. The light emitting window 31 is formed in a portion on the inner side of the p-electrode 41 that is formed in the circular ring shape at the upper surface of the mesa 30.

Method of Manufacturing Surface Emitting Laser

Next, a method of manufacturing the surface emitting laser according to one embodiment will be described, by referring to FIG. 6 through FIG. 10. FIG. 6 through FIG. 10 are diagrams illustrating processes of the method of manufacturing the surface emitting laser according to one embodiment.

Figure 6:
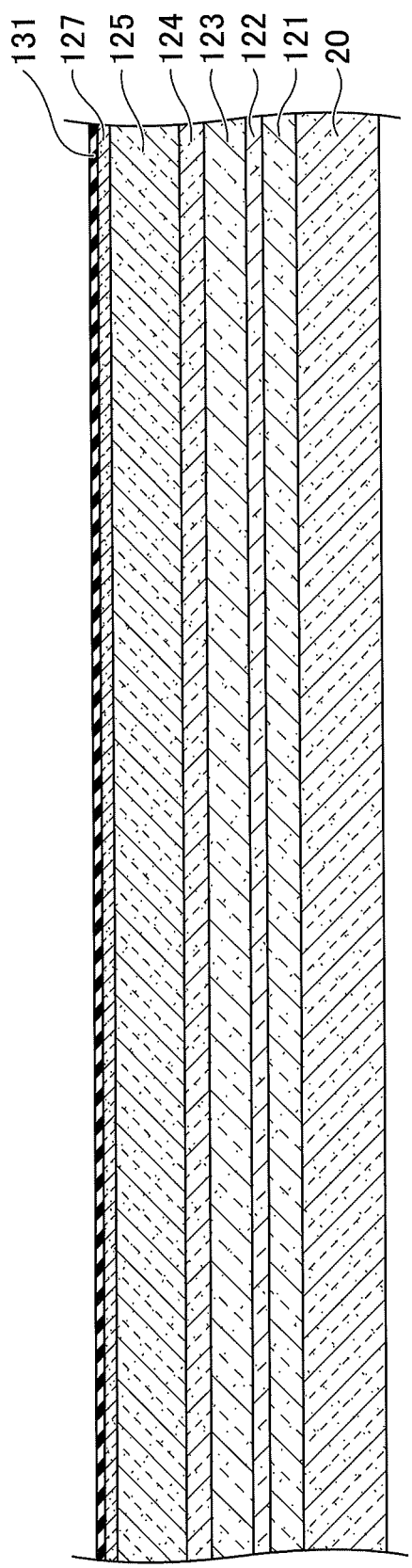
FIG. 6 is a diagram illustrating a process of a method of manufacturing the surface emitting laser according to one embodiment of the present disclosure.

First, in the process or step illustrated in FIG. 6, the first lower DBR layer 121, the lower contact layer 122, the second lower DBR layer 123, the active layer 124, the upper DBR layer 125, and the upper contact layer 127 are successively grown epitaxially on the substrate 20 in a wafer state. More particularly, the semiconductor layers including the first lower DBR layer 121, the lower contact layer 122, the second lower DBR layer 123, the active layer 124, the upper DBR layer 125, and the upper contact layer 127, may be formed by metal organic chemical vapor deposition (MOCVD), molecular beam epitaxy (MBE), or the like.

The upper DBR layer 125 includes the $Al_xGa_{1-x}As$ layer ($0.95<=x<=1.0$) for forming the oxidation region 126a of the current constriction structure 126. Thereafter, the first insulating layer 131 is formed on the upper contact layer 127 by plasma chemical vapor deposition (CVD) or the like, for example.

Figure 7:
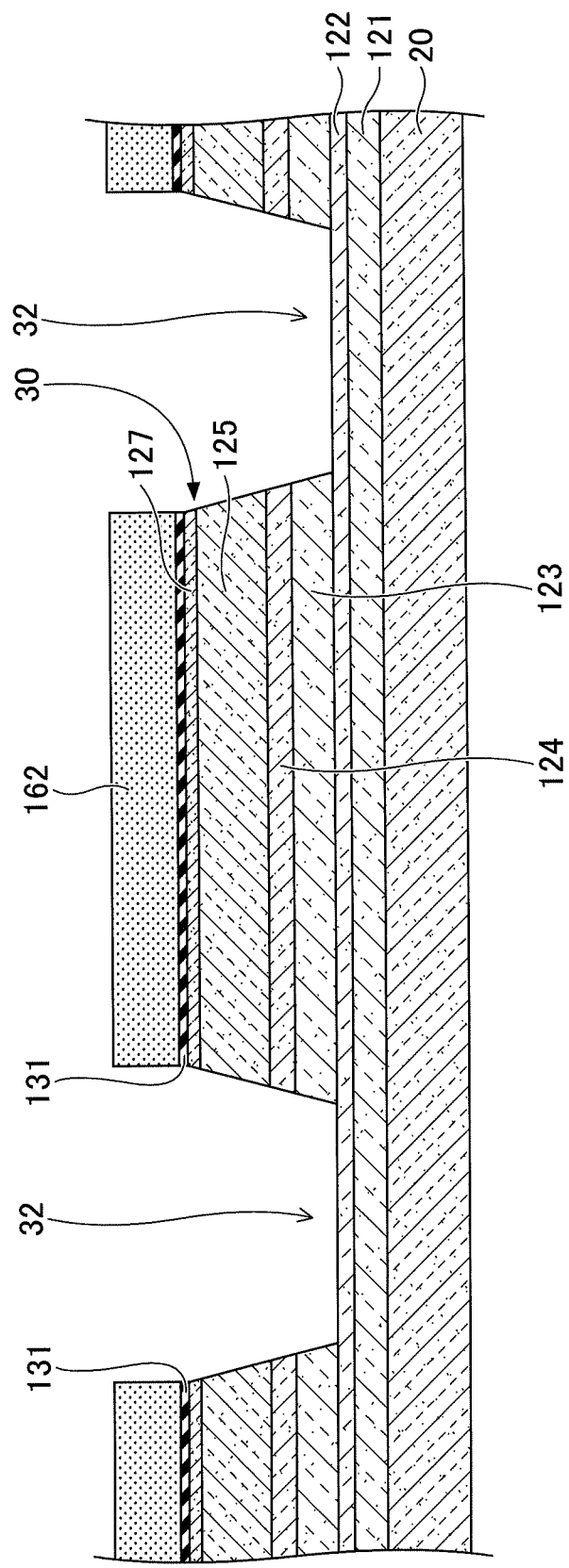
FIG. 7 is a diagram illustrating a process of the method of manufacturing the surface emitting laser according to one embodiment of the present disclosure.

Next, in the process or step illustrated in FIG. 7, a mask 162 is formed on the first insulating layer 131. Thereafter, in a region where the mask 162 is not formed, the upper contact layer 127, the upper DBR layer 125, the active layer 124, and the second lower DBR layer 123 are removed by dry etching until the lower contact layer 122 becomes exposed, to form the groove 32, and thereby form the mesa 30. For example, an inductively coupled plasma reactive ion etching (ICP-RIE) apparatus may be used to perform the dry etching. Thereafter, the mask 162 is removed by an organic solvent or the like.

Figure 8:
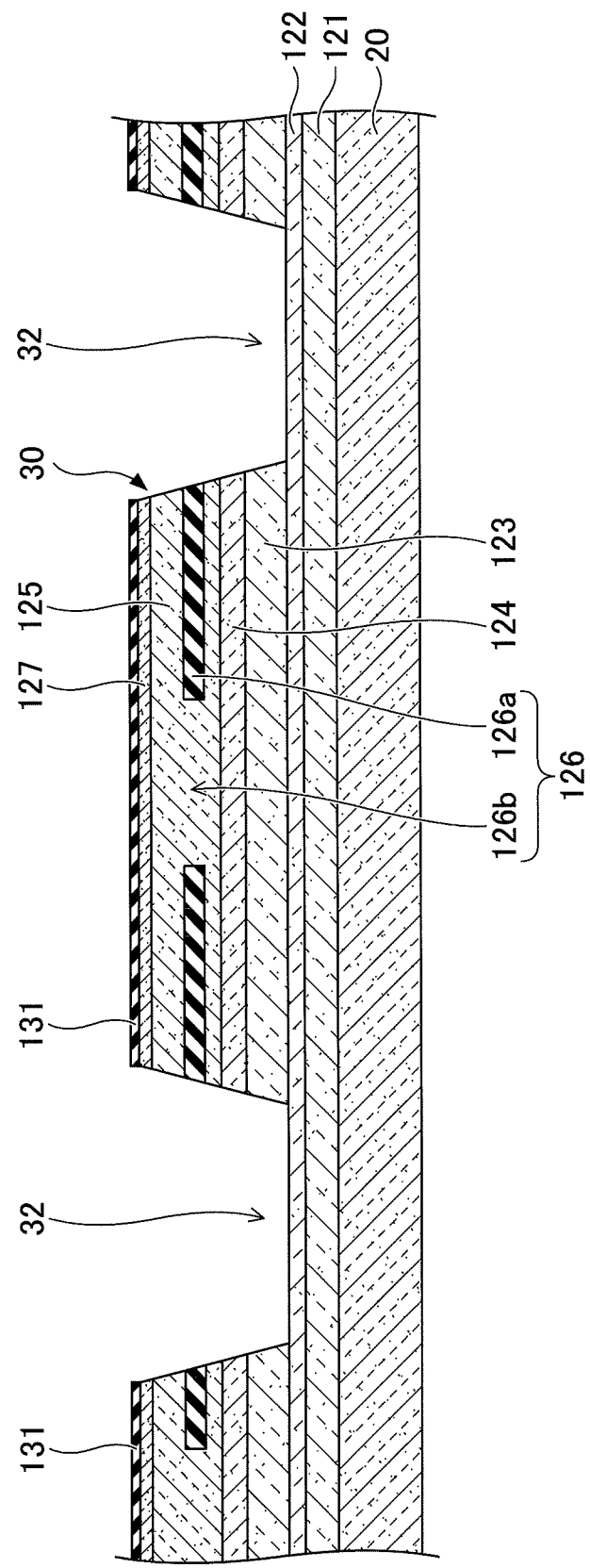
FIG. 8 is a diagram illustrating a process of the method of manufacturing the surface emitting laser according to one embodiment of the present disclosure.

Next, in the process or step illustrated in FIG. 8, the $Al_xGa_{1-x}As$ layer ($0.95<=x<=1.0$) of the upper DBR layer 125 is heated to a temperature of approximately 400° C. in a vapor atmosphere, for example, to form the oxidation region 126a by oxidation performed from the side surfaces of the mesa 30. The oxidation region 126a may be formed by adjusting the heating time, until the aperture region 126b at a non-oxidized portion surrounded by the oxidation region 126a becomes a predetermined size. Thereafter, the upper contact layer 127 to the first lower DBR layer 121 are removed by dry etching, to form a device isolation groove (not illustrated) having a depth of 8 μm, for example.

Figure 9:
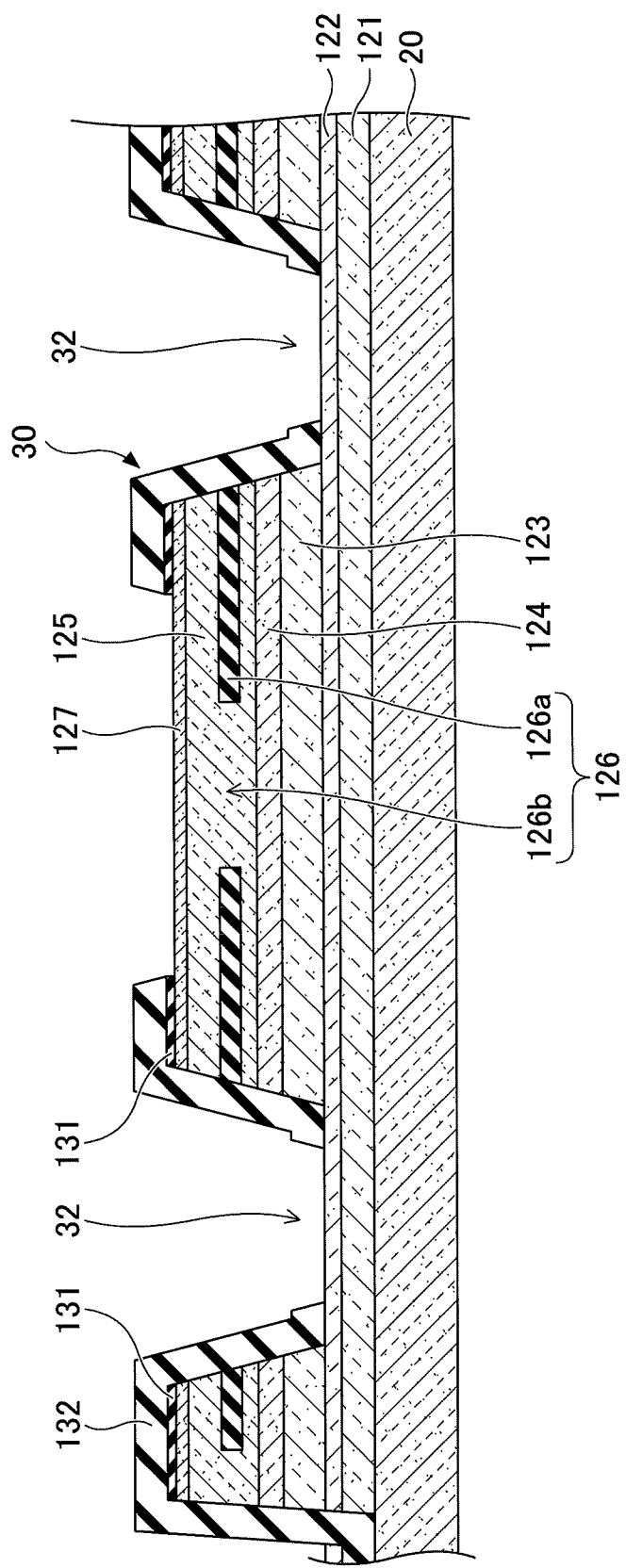
FIG. 9 is a diagram illustrating a process of the method of manufacturing the surface emitting laser according to one embodiment of the present disclosure.

Next, in the process or step illustrated in FIG. 9, the second insulating layer 132 is formed by plasma CVD or the like, for example. Further, an opening is formed in the second insulating layer 132, at the upper surface part of the mesa 30, and the bottom surface part of the groove 32.

Figure 10:
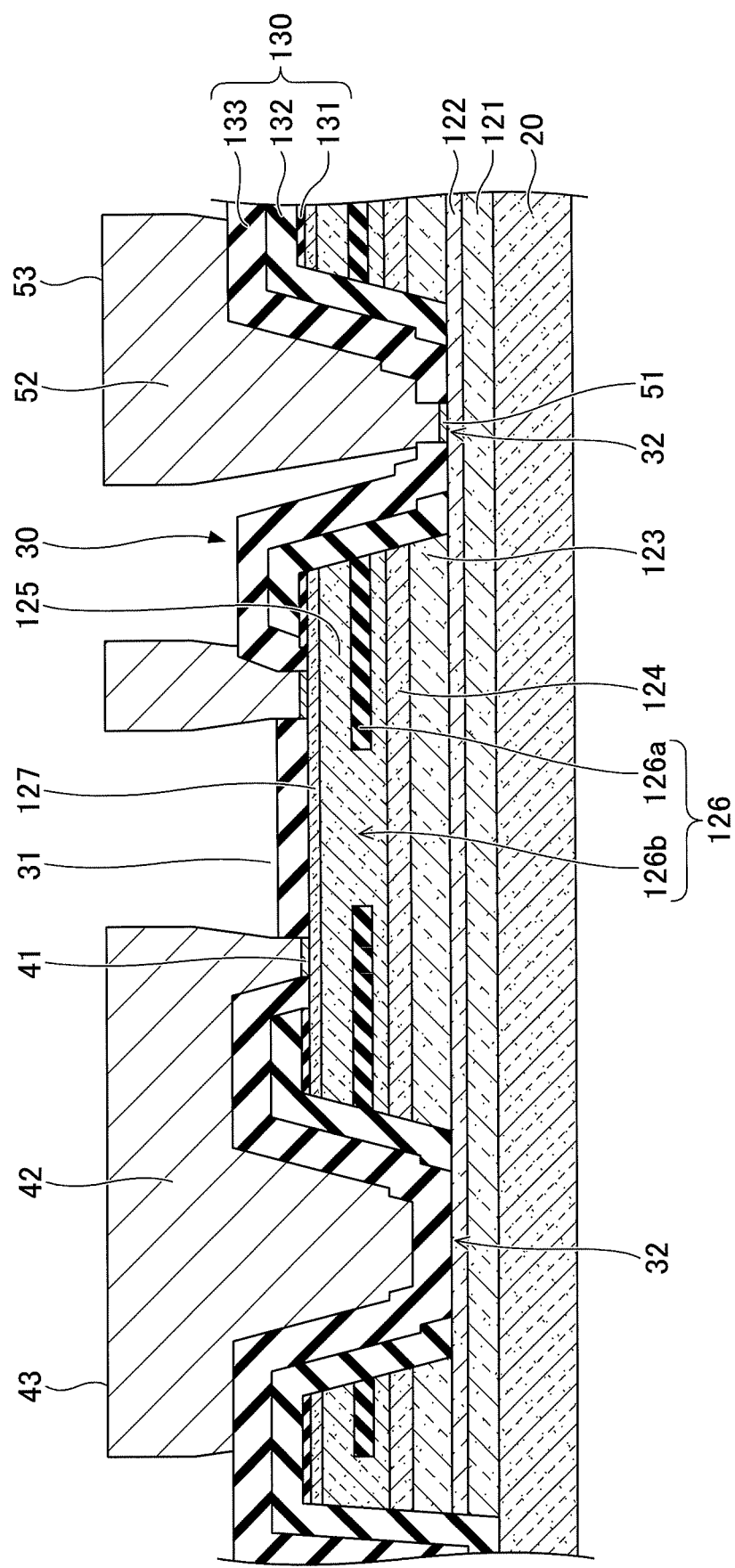
FIG. 10 is a diagram illustrating a process of the method of manufacturing the surface emitting laser according to one embodiment of the present disclosure.

Next, in the process or step illustrated in FIG. 10, the third insulating layer 133 is formed, and an opening is formed in the third insulating layer 133, at a portion of the upper surface part of the mesa 30, and the bottom surface part of the groove 32. Thereafter, a resist pattern is formed, and vacuum deposition is performed, to form the p-electrode 41 on the upper contact layer 127, and form the n-electrode 51 on the lower contact layer 122. Then, an ohmic contact is formed by performing a heat treatment. This heat treatment is performed at a temperature lower than the temperature at which the oxidation region 126a is formed, that is, at the temperature of 370° C. or higher and 400° C. or lower, for example.

Next, the interconnect 42 is formed on the p-electrode 41 and the third insulating layer 133, and the interconnect 52 is formed on the n-electrode 51 and the third insulating layer 133. Accordingly, the p-electrode pad 43 that is electrically connected to the p-electrode 41 via the interconnect 42, and the n-electrode pad 53 that is electrically connected to the n-electrode 51 via the interconnect 52, are formed. Thereafter, the substrate 20 in the wafer state is cut and segmented, so as to form chips of the surface emitting laser.

The surface emitting laser according to one embodiment can be manufactured by the processes (or steps) described above in conjunction with FIG. 6 through FIG. 10.

Hence, according to the embodiments described above, it is possible to provide a surface emitting laser that enables an electrode to make a satisfactory ohmic contact with the contact layer, and reduces the light absorption by the contact layer.

Further, the present invention is not limited to these embodiments, but various variations, modifications, and substitutions may be made without departing from the scope of the present invention.

What is claimed is:

1. A surface emitting laser comprising:
a substrate;
a mesa of semiconductor layers including a lower reflector layer, an active layer, an upper reflector layer, and an upper contact layer that are successively laminated on the substrate; and
an electrode provided on the upper contact layer,
wherein the upper contact layer includes GaAs,
wherein the electrode includes a Pt alloy layer in contact with the upper contact layer, and a Ti layer provided on the Pt alloy layer, and
wherein the Pt alloy layer has a thickness of 5 nm or greater and 100 nm or less.

2. The surface emitting laser as claimed in claim 1, wherein the upper contact layer has a thickness of 10 nm or greater and 200 nm or less.

3. The surface emitting laser as claimed in claim 2, wherein the electrode further includes a first Pt layer provided on the Ti layer.

4. The surface emitting laser as claimed in claim 1, wherein the electrode further includes a first Pt layer provided on the Ti layer.

5. The surface emitting laser as claimed in claim 1, wherein
the electrode has a circular ring shape, and
an inner side of the electrode includes a light emitting window though which laser light is emitted.

6. A surface emitting laser comprising:
a substrate;
a mesa of semiconductor layers including a lower reflector layer, an active layer, an upper reflector layer, and an upper contact layer that are successively laminated on the substrate; and
an electrode provided on the upper contact layer,
wherein the upper contact layer includes GaAs,
wherein the electrode includes a Pt alloy layer in contact with the upper contact layer, and a Ti layer provided on the Pt alloy layer, and
wherein the electrode further includes a first Pt layer provided on the Ti layer.

7. The surface emitting laser as claimed in claim 6, wherein
the electrode has a circular ring shape, and
an inner side of the electrode includes a light emitting window though which laser light is emitted.

8. A surface emitting laser comprising:
a substrate;

a mesa of semiconductor layers including a lower reflector layer, an active layer, an upper reflector layer, and an upper contact layer that are successively laminated on the substrate; and an electrode provided on the upper contact layer, wherein the upper contact layer includes GaAs, wherein the electrode includes a Pt alloy layer in contact with the upper contact layer, and a Ti layer provided on the Pt alloy layer, and wherein the lower reflector layer includes
 a first lower reflector layer provided on the substrate, and
 a second lower reflector layer provided between the first lower reflector layer and the active layer.

9. A surface emitting laser comprising:

a substrate;

a mesa of semiconductor layers including a first lower reflector layer, a lower contact layer, a second lower reflector layer, an active layer, an upper reflector layer, and an upper contact layer that are successively laminated on the substrate, and an electrode provided on the upper contact layer, wherein the electrode includes an alloy layer including Pt, in contact with the upper contact layer, wherein the upper contact layer is formed by a p-type $Al_{0.16}Ga_{0.84}As$ layer that has a thickness of 10 nm or greater and 200 nm or less, and wherein the lower contact layer is formed by an n-type $Al_{0.1}Ga_{0.9}As$ layer that has a thickness greater than the thickness of the upper contact layer.

10. The surface emitting laser as claimed in claim 9, wherein the first lower reflector layer, the second lower reflector layer, and the upper reflector layer are formed by a distributed Bragg reflector layer, respectively.

11. The surface emitting laser as claimed in claim 9, further comprising:
 another electrode provided on the lower contact layer.

12. The surface emitting laser as claimed in claim 9, wherein the active layer is formed by a multiple quantum well structure in which a InGaAs layer and a AlGaAs layer are alternately laminated.

13. A surface emitting laser comprising:

a substrate;

a mesa of semiconductor layers including a lower reflector layer, an active layer, an upper reflector layer, and an upper contact layer that are successively laminated on the substrate; and an electrode provided on the upper contact layer, wherein the upper contact layer includes GaAs, wherein the electrode includes a Pt alloy layer in contact with the upper contact layer, and a Ti layer provided on the Pt alloy layer, and wherein the Pt alloy layer includes Pt diffused into and in contact with the upper contact layer.

14. A surface emitting laser comprising:

a substrate;

a mesa of semiconductor layers including a lower reflector layer, an active layer, an upper reflector layer, and an upper contact layer that are successively laminated on the substrate; and an electrode provided on the upper contact layer, wherein the upper contact layer includes GaAs, wherein the electrode includes a Pt alloy layer in contact with the upper contact layer, and a Ti layer provided on the Pt alloy layer, and wherein the Pt alloy layer is a Ti-free alloy layer.

15. A surface emitting layer comprising:

a substrate;

a mesa of semiconductor layers including a lower reflector layer, an active layer, an upper reflector layer, and an upper contact layer that are successively laminated on the substrate; and an electrode provided on the upper contact layer, wherein the upper contact layer includes GaAs, wherein the electrode includes a Pt alloy layer in contact with the upper contact layer, and a Ti layer provided on the Pt alloy layer, and wherein the Pt alloy layer is formed by GaAs forming the upper contact layer, and a second Pt layer making contact with the upper contact layer.

* * * * *